(12) United States Patent
Markovitz et al.

(10) Patent No.: US 9,065,784 B2
(45) Date of Patent: Jun. 23, 2015

(54) EFFICIENT PAYLOAD REASSEMBLY

(71) Applicant: Gilat Satellite Networks Ltd., Petah Tikva (IL)

(72) Inventors: Oren Markovitz, Raanana (IL); Rafi Heiman, Ramot-Hashavim (IL); Idit Chen, Rosh-Ha'Ayin (IL)

(73) Assignee: Gilat Satellite Networks Ltd., Petah Tikva (IL)

( * ) Notice: Subject to any disclaimer, the term of this patent is extended or adjusted under 35 U.S.C. 154(b) by 121 days.

(21) Appl. No.: 14/021,004

(22) Filed: Sep. 9, 2013

(65) Prior Publication Data

US 2014/0071998 A1    Mar. 13, 2014

Related U.S. Application Data

(60) Provisional application No. 61/699,362, filed on Sep. 11, 2012.

(51) Int. Cl.
*H04J 3/24* (2006.01)
*H04L 12/861* (2013.01)
*H04L 1/00* (2006.01)

(52) U.S. Cl.
CPC .......... *H04L 49/9057* (2013.01); *H04L 1/0061* (2013.01); *H04L 1/00* (2013.01)

(58) Field of Classification Search
None
See application file for complete search history.

(56) References Cited

U.S. PATENT DOCUMENTS

| 5,912,881 | A  | * | 6/1999 | Glaise et al. | 370/252 |
| 7,577,896 | B2 | * | 8/2009 | Uzrad-Nali et al. | 714/758 |
| 8,397,151 | B2 | * | 3/2013 | Salgado et al. | 714/799 |

* cited by examiner

*Primary Examiner* — Timothy J Weidner
*Assistant Examiner* — Jana Blust
(74) *Attorney, Agent, or Firm* — Banner & Witcoff, Ltd.

(57) ABSTRACT

A communication system comprises one or more transmitters and a receiving station. A transmitter segments a payload to be transmitted into multiple fragments and transmits each fragment of the payload in a different transmission. The receiving station receives the fragments, reassembles the payload from the received fragments and validates the integrity of the payload. Methods are presented for efficiently rebuilding a payload from fragments of the payload and for validating the integrity of the payload.

15 Claims, 3 Drawing Sheets

EFFICIENT PAYLOAD REASSEMBLY

PRIORITY CLAIM

This application claims priority to U.S. Provisional Patent Application Ser. No. 61/699,362, filed Sep. 11, 2012, and entitled "Efficient Payload Reassembly," the disclosure of which is incorporated by reference herein in its entirety and made part hereof.

FIELD

Aspects of the disclosure pertain to the field of communication systems.

BACKGROUND

In a communication system, one or more transmitters transmit over a shared medium towards a receiving station. The shared medium could include multiple channels, allowing several transmitters to simultaneously transmit towards the receiving station. At the receiving station, a plurality of receivers is used for receiving the transmissions.

A transmitter could segment a payload to several fragments and transmit each fragment towards the receiving station in a separate transmission. Different fragments of the payload could be transmitted over different channels within the shared medium and received by different receivers at the receiving station. Each fragment includes an identifier of the transmitter to allow the receiving station to distinguish between fragments and payloads of different transmitters.

To protect the integrity of the payload, the transmitter computes a Cyclic Redundancy Check (CRC) code for the payload and attaches the computed code to the first fragment of the payload. After receiving all the fragments of the payload (via the plurality of receivers), the receiving station rebuilds (reassembles) the payload from the fragments and validates the content of the payload by computing the CRC code for the rebuilt payload and comparing it with the CRC code which the transmitter attached to the first fragment.

However, before the receiving station can rebuild the payload from the received fragments, the receiving station needs to determine that all the fragments of the payload were received. Such determining is often based on including a sequence number in each fragment and an additional total fragment count in the first fragment. Unfortunately, the fragment numbering information is overhead which reduces the efficiency of the communication system. Alternatively, the receiving station can determine that the last fragment of the payload was received if a predefined interval has passed from the time of receiving the last fragment without receiving additional fragments for the payload. However, this alternative introduces latency to the communication system in addition to being vulnerable to errors. The receiving station could decide that all fragments were received while in fact one or more additional fragments are delayed (for example due to high load on the shared medium).

SUMMARY

The following presents a simplified summary in order to provide a basic understanding of some aspects of the disclosure. The summary is not an extensive overview of the disclosure. It is neither intended to identify key or critical elements of the disclosure nor to delineate the scope of the disclosure. The following summary merely presents some aspects of the disclosure in a simplified form as a prelude to the description below.

Aspects of the disclosure are directed to methods for rebuilding (reassembling) a payload from one or more fragments of the payload and for validating the integrity of the data included in the rebuilt payload. In some embodiments, reception of the last fragment of the payload may be determined without requiring any of the fragments to be numbered and without waiting for a next fragment for any period of time. In some embodiments, said validation may be included in said determining, wherein the amount of calculations needed for said validation and/or determining may be in about the same order of magnitude as the calculations required for computing a CRC code for the whole payload.

BRIEF DESCRIPTION OF THE DRAWINGS

Figure 1:
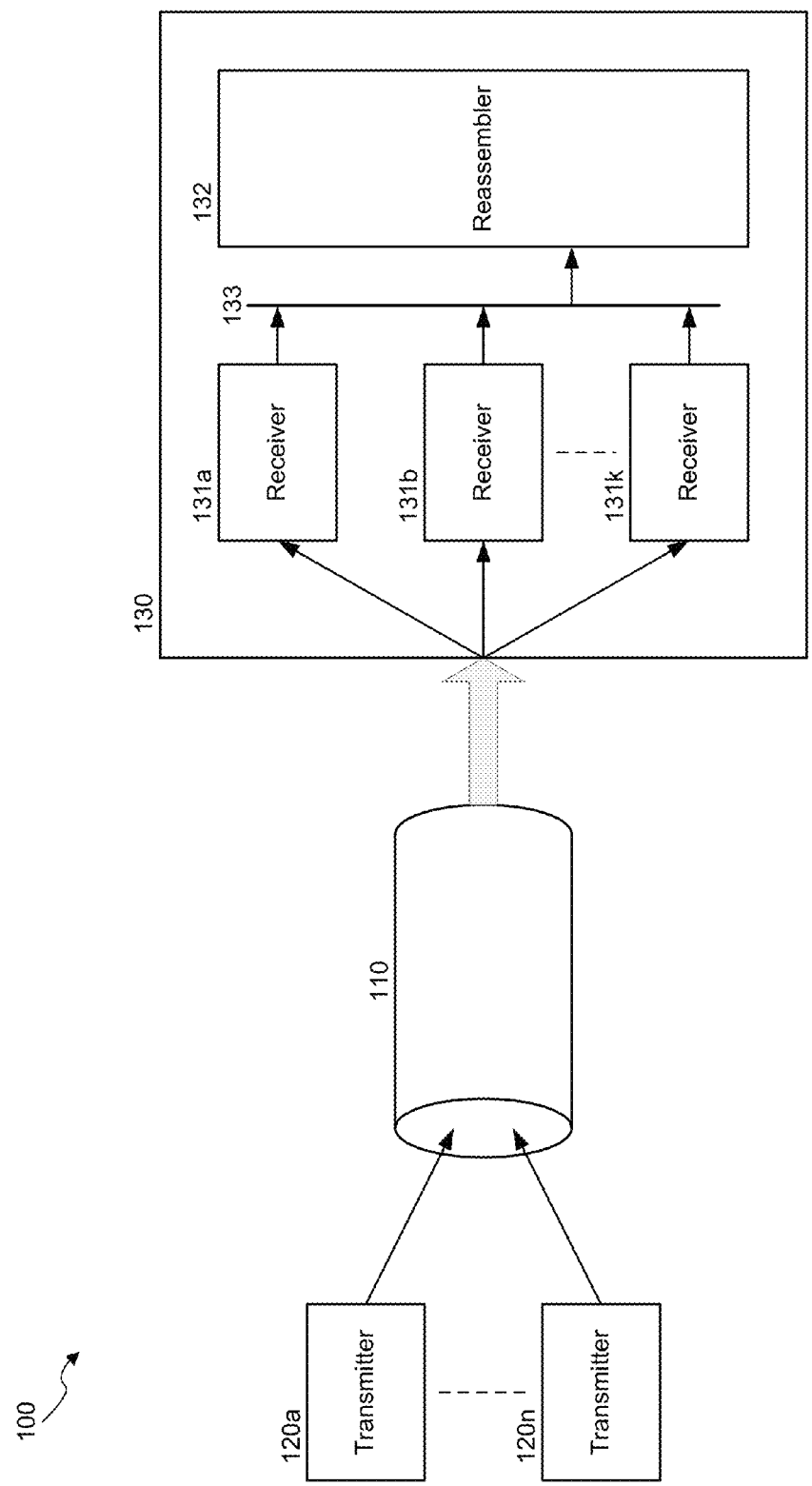

Having thus described the disclosure in general terms, reference will now be made to the accompanying drawings, which are not necessarily drawn to scale, and wherein:

FIG. 1 shows an example of a communication system in accordance with aspects of the disclosure.

Figure 2:
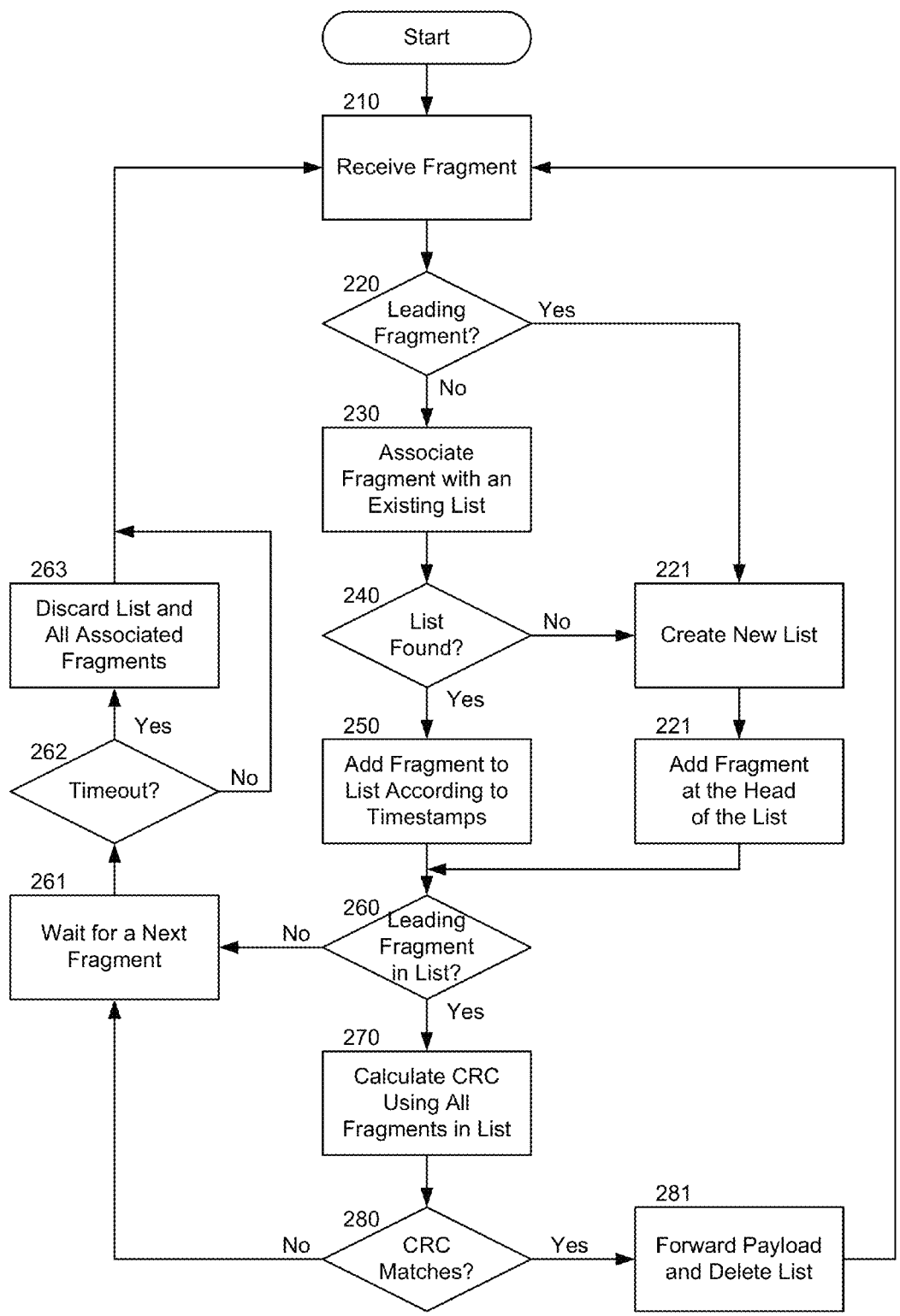

FIG. 2 shows a flow chart of an exemplary reassembly algorithm in accordance with aspects of the disclosure.

Figure 3:
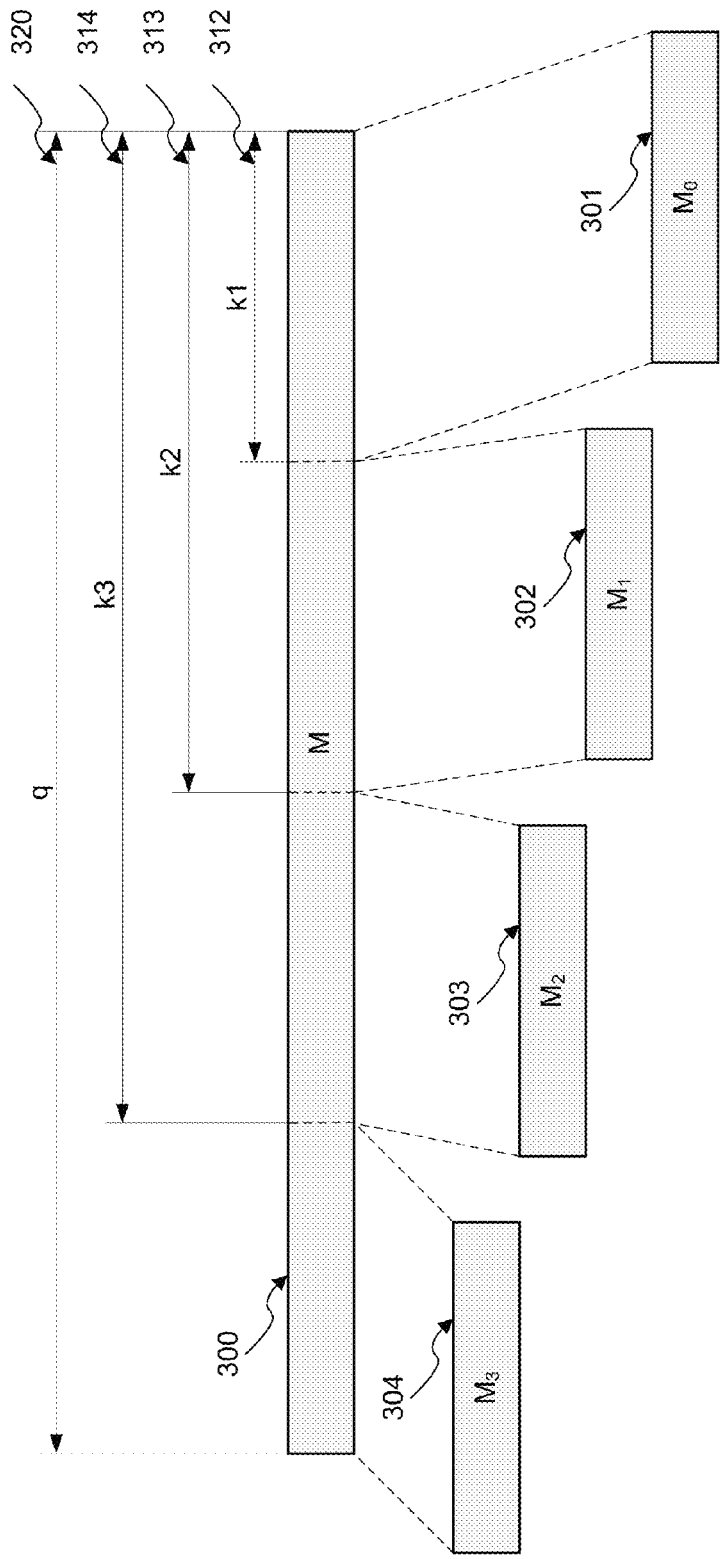

FIG. 3 shows a diagram of an exemplary payload and its fragments in accordance with aspects of the disclosure.

DETAILED DESCRIPTION

Referring to FIG. 1, a communication system 100 may comprise one or more transmitter(s) 120*a-n*, a shared medium 110 and a receiving station 130. The one or more transmitter(s) 120*a-n* may be configured to transmit over shared medium 110 towards receiving station 130, wherein several transmitters of the one or more transmitter(s) 120*a-n* may simultaneously transmit towards receiving station 130 over a plurality of channels that may be included in the shared medium 110. Receiving station 130 may comprise a plurality of receivers 131*a-k*, for at least the purpose of receiving transmissions from the one or more transmitter(s) 120*a-n*, and a re-assembler 132.

A transmitter, for example transmitter 120*a*, may be configured to segment a payload to one or more fragments and transmit each of the one or more fragments towards receiving station 130, e.g. to transmit each fragment in a separate transmission. Transmitter 120*a* may be further configured to compute a Cyclic Redundancy Check (CRC) code for the payload and to transmit the computed CRC code together with the first fragment of the payload, e.g. in the same transmission.

Transmitter 120*a* may be configured to transmit the fragments sequentially via medium 110, e.g. one after the other in accordance with their order within the respective payload. As medium 110 may inflict about the same latency on all fragments, the fragments may arrive at receiving station 130 at the same order as they may be transmitted (e.g. the first fragment transmitted may arrive first, the second fragment transmitted may arrive second, and so on). This order may be further maintained regardless of whether the fragments are received by a single receiver or by several receivers (e.g. each one of the several receivers may receive only some of the fragments).

Receiving station 130 may be configured to receive (e.g. using receivers 131*a-k*) one or more fragments of a payload, to rebuild (reassemble) the payload from the received one or more fragments and to validate the content of the payload (e.g. at re-assembler 132). In some embodiments, said validation may be performed by computing a CRC code for the rebuilt payload and comparing it with a CRC code which the transmitter of said one or more fragments may have attached to the first fragment of the payload.

Receivers 131a-k of receiving station 130 may be configured to receive one or more fragments of a payload. In some embodiments, each receiver of receivers 131a-k may be configured to maintain a synchronized clock, so that all receives 131a-k may have about the same clock value at the same time. Each receiver of receivers 131a-k may be configured upon receiving a fragment of a payload to create a timestamp based on said synchronized clock, to attach the timestamp to the received fragment (e.g. for at least the purpose of indicating a reception time for the received fragment) and to forward the time-stamped received fragment to re-assembler 132. In some embodiments, the process of creating a timestamp and attaching it to a received fragment may be implemented in hardware, for example in order to have this process take about the same time in each of the receivers 131a-k.

Re-assembler 132 may be configured to simultaneously reassemble and validate multiple payloads, for example payloads simultaneously transmitted by multiple transmitters out of the one or more transmitter(s) 120a-n. Nevertheless, re-assembler 132 may be configured to reassemble and/or validate each payload independently of reassembling and/or validating any other payloads. In some embodiments, each fragment may include an identifier of a respective transmitter and/or an identifier of a respective stream of payloads, thus allowing re-assembler 132 to distinguish, for example, between fragments of different payload streams and/or between fragments transmitted by different transmitters.

Referring to FIG. 2, re-assembler 132 may be configured upon receiving a fragment (step 210) to determine whether this fragment is a leading fragment of a payload or a non-leading fragment (step 220), wherein a leading fragment may be the first fragment of the payload and may include a CRC code for the payload (e.g. as may be calculated by the respective transmitter), and wherein a non-leading fragment may be any fragment of the payload other than the first fragment of the payload. If the received fragment is a leading fragment of a payload, re-assembler 132 may be configured to start a new ordered list of fragments (step 221) and to place the received leading fragment at the head of that list (step 222). If the received fragment is a non-leading fragment of a payload, re-assembler 132 may be configured to try associating the received non-leading fragment with an already existing list of fragments (for example based on a transmitter and/or a stream identifier(s) included in each fragment) and to add the non-leading fragment to the respective list of fragments, if such list exists (steps 230, 240 and 250). If the received fragment is a non-leading fragment and it may not be associated with any existing list of fragments, re-assembler 132 may be configured to start a new ordered list of fragments (step 221) and place the received non-leading fragment at the head of the newly started list (step 222). The latter scenario may occur for example due to re-assembler 132 receiving a non-leading fragment from receivers 131a-k prior to receiving the respective leading fragment as described herein.

Although the received fragments may be received at receive station 130 in the same order as they were transmitted, and time-stamped by receivers 131a-k in the same order as the order of transmission, the time-stamped received fragments may be forwarded by receivers 131a-k to re-assembler 132 in a different order, for example due to forwarding the time-stamped fragments over a shared medium (e.g. LAN 133), or due to different processing durations in different receivers. Thus, re-assembler 132 may be configured upon receiving fragments of a payload to order them in accordance with their attached timestamps (step 250), for at least the purpose of ordering the fragments in accordance with their order of transmission, which may correspond to their order within the payload. Re-assembler 132 may be configured to add a non-leading fragment to an existing list of fragments in accordance with the timestamp attached to the non-leading fragment and the one or more timestamps attached to the one or more fragments already included in the list of fragments respectively (step 250), so that the list may remain sorted in accordance with the reception time of the fragments after the non-leading fragment has been added.

After placing a received fragment in an ordered list of fragments, re-assembler 132 may be configured (step 260) to determine whether the respective list of fragments includes a leading fragment (e.g. whether the first fragment in the list is a leading fragment). If the respective list of fragments does not include a leading fragment, re-assembler 132 may be configured to wait for additional fragments to be received (step 261). However, if the respective list of fragments includes a leading fragment, re-assembler 132 may be configured to calculate a CRC code for a payload reassembled from all the fragments currently in the list (step 270) and to compare the calculated CRC code with the CRC code included in the leading fragment (step 280). If the calculated CRC code is the same as the CRC code included in the leading fragment, re-assembler 132 may be configured to determine that all the fragments of the payload were received and that the payload may be successfully reassembled. Upon so determining, re-assembler 132 may be configured to (step 281) terminate the reassembly process for this payload and, in some embodiments, may forward the re-assembled payload to a higher-layer function that may be included in receiving station 130 (not shown in FIG. 1). However, if the calculated CRC code is different than the CRC code included in the leading fragment, re-assembler 132 may be configured to determine that at least one more fragment of the respective payload may yet to be received and to wait for the at least one more fragment (step 261). Re-assembler 132 may be further configured upon determining that a preconfigured interval may have elapsed since the reception of a last fragment of a payload (step 262), to determine that the payload may not be successfully reassembled and to discard all the received fragments corresponding to that payload (step 263). Such a scenario may occur, for example, if one or more fragments were not received by receivers 131a-k (e.g. due to interferences on medium 110), or if the fragments may have been received with errors, which may cause the calculated CRC code for the reassembled payload to be different from a CRC code which may be included in the leading fragment of the payload and which may have been calculated by the transmitter for the payload prior to transmitting it (e.g. as fragments).

In some embodiments, re-assembler 132 may be configured to calculate the CRC code for a payload comprised of one or more fragments (e.g. as in step 270 in FIG. 2) using one or more CRC codes previously calculated for each of the one or more fragments respectively. Re-assembler 132 may receive fragments of a payload from multiple receivers, reassemble the payload and use such pre-calculated partial CRC codes for at least the purpose of validating the payload (e.g. verifying that all the fragments of the payload were correctly received) with a minimum amount of computation, while perhaps introducing a minimum latency and without needing the fragments to be numbered.

In some embodiments, re-assembler 132 may be configured to calculate a CRC code for each received fragment, for example, upon receiving the fragment (e.g. step 210 of FIG.

2), or upon adding the fragment to a list of fragments (e.g. steps 221 and/or 250), or at any other time prior to calculating the CRC code for the reassembled payload (e.g. step 270). In some embodiments, re-assembler 132 may be configured to receive each fragment together with the CRC code for that fragment attached to the fragment. For example, each receiver 131a-k may be configured to calculate a CRC code for each received fragment, to attach the calculated CRC code to the received fragment (e.g. in addition to attaching a timestamp) and to forward the time-stamped received fragment with the calculated CRC code to re-assembler 132. In some embodiments, re-assembler 132 may be configured to determine if a received fragment has a CRC code attached to it and to calculate a CRC code for the received fragment if a CRC code is not attached to the received fragment.

Let M represent a payload, which may be transmitted in n fragments denoted $M_0$ to $M_{n-1}$, wherein $M_0$ may represent the fragment containing the least significant bits of payload M and $M_{n-1}$ may represent the fragment containing the most significant bits of payload M. In some embodiments, fragment $M_0$ may also be the leading fragment and/or the first fragment to be transmitted. In addition, let $CRC(M_i)$ represent the CRC code for fragment $M_i$ (for each $0 \leq i \leq n-1$). Thus, re-assembler 132 may be configured to calculate a CRC code for the entire payload M (e.g. CRC(M)) using CRC codes corresponding to fragments $M_0$ to $M_{m-1}$ (e.g. $CRC(M_0)$ to $CRC(M_{n-1})$, respectively) as shown herein.

CRC calculation may be based on arithmetic of polynomials over the binary field GF(2), wherein GF(2) is the Galois Field of two elements. Thus, in the following description the asterisk sign (*) may represent polynomials multiplication over GF(2), and the plus sign (+) may represent polynomials addition over GF(2). In addition, bit strings may be represented as polynomials over GF(2). For example, the bit string "1011" may be represented using the polynomial $x^3+x+1$.

A CRC code may be calculated using a polynomial g(x) of a degree r (e.g. having r+1 coefficients). For example, in the case of CRC-32, the degree of the polynomial g(x) is 32 (r=32). In addition, a CRC calculation may be defined and/or implemented in terms of a linear feedback shift register (LFSR) of a length r. There may be two variants for CRC calculation, which may differ by the initialization of the LFSR prior to passing the bit-string for which CRC should be calculated through the LFSR. In one variant, the LFSR may be initialized with all its bits set to 0 (referred to herein as 0-initialized, for example 0x0000 for CRC-32, wherein 0x0000 is the hexadecimal notation for a string of 32 bits all set to 0). In the other variant, the LFSR may be initialized with all its bits set to 1 (referred to herein as 1-initialized, for example 0xFFFF for CRC-32, wherein 0xFFFF is the hexadecimal notation for a string of 32 bits all set to 1).

Let $CRC_0(M)$ represent the 0-initialized CRC code for payload M. $CRC_0(M)$ may be mathematically defined as follows (Eq. 1):

$$CRC_0(M) = [M(x)*x^r] \mod g(x)$$

Wherein M(x) may be the polynomial representation of payload M, g(x) may be the polynomial that may be used for calculating the CRC, r may be the degree of g(x) and mod may be the modular polynomial division.

Let $CRC_1(M)$ represent the 1-initialized CRC code for a payload M after flipping (e.g. changing a 1 to a 0, or a 0 to 1) the r most significant bits of payload M before the CRC calculation. $CRC_1(M)$ may be mathematically defined as follows (Eq. 2):

$$CRC_1(M) = \{[M(x)+F(x)*x^{(q-r)}]*x^r\} \mod g(x)$$

Wherein M(x) may be the polynomial representation of payload M, g(x) may be the polynomial that may be used for calculating the CRC, r may be the degree of g(x), q−1 may be the degree of M(x), mod may be the modular polynomial division, and F(x) may be a polynomial representing r bits all set to 1 (e.g. of degree r−1).

It may be noted that though many publications regarding CRC calculation may discuss the 0-initialized variant ($CRC_0$), it may be the 1-initialized variant (i.e. $CRC_1$) which may be more commonly used in many communication systems. Thus, the following disclosure may present a method for CRC calculation (e.g. for payload M) in accordance with the 1-initialized variant ($CRC_1$). However, as presented herein, calculation of a 1-initialized CRC (e.g. for a payload M) in an efficient manner may be based on calculations in accordance with the 0-initialized variant ($CRC_0$).

In order to simplify the description of the algorithm, the following description is based on an example payload M as shown in FIG. 3 (e.g. payload M 300), wherein in this example payload M may be transmitted in 4 fragments (e.g. n=4), $M_0$ to $M_3$ (301 to 304 respectively). Nevertheless, the algorithm may be applied to any payload with any number of fragments without departing from the scope of this disclosure.

Let M(x) be the polynomial representation of payload (bit string) M, and let $M_i(x)$ be the polynomial representation of fragment (bit string) $M_i$ of payload M. Thus, the relation between the polynomial representation of payload M and the polynomial representations of all the fragments of payload M may be as follows (Eq. 3):

$$M(x)=M_3(x)*x^{k3}+M_2(x)*x^{k2}+M_1(x)*x^{k1}+M_0(x)$$

Wherein k3 may be the offset of fragment $M_3$ within payload M (314) (e.g. the total number of bits in fragments $M_2$, $M_1$ and $M_0$), k2 may be the offset of fragment $M_2$ within payload M (313) (e.g. the total number of bits in fragments $M_1$ and $M_0$), and k1 may be the offset of fragment $M_1$ within payload M (312) (e.g. the number of bits in fragment $M_0$). Let q represent the total number of bits in payload M (320) (e.g. over which a CRC code may be calculated).

Given $CRC_0(M_i)$ for each fragment $M_i$ of payload M, $CRC_0(M)$ may be calculated (e.g. in accordance with Eq. 1 and Eq. 3) as follows (Eq. 4):

$$\begin{aligned}CRC_0(M) &= [M(x)*x^r] \mod g(x) = \\ &= \left\{\begin{bmatrix} M_3(x)*x^{k3} + M_2(x)*x^{k2} + \\ M_1(x)*x^{k1} + M_0(x) \end{bmatrix} * x^r\right\} \mod g(x) = \\ &= \begin{cases} [[M_3(x)*x^r] \mod g(x)] * [x^{k3} \mod g(x)] + \\ [[M_2(x)*x^r] \mod g(x)] * [x^{k2} \mod g(x)] + \\ [[M_1(x)*x^r] \mod g(x)] * [x^{k1} \mod g(x)] + \\ [[M_0(x)*x^r] \mod g(x)] \end{cases} \mod g(x) = \\ &= \begin{cases} CRC_0(M_3) * [x^{k3} \mod g(x)] + \\ CRC_0(M_2) * [x^{k2} \mod g(x)] + \\ CRC_0(M_1) * [x^{k1} \mod g(x)] + \\ CRC_0(M_1)] \end{cases} \mod g(x)\end{aligned}$$

The second step in Eq. 4 may follow from Eq. 3. The third and the fourth steps in Eq. 4 may be derived from the second step using two valid principles for polynomial arithmetic: the linearity of modular polynomial division (e.g. (a+b) mod c=(a mod c)+(b mod c)), and the fact that a modular multiplication can be preceded by a modular reduction of each factor first (e.g. (a*b) mod c=((a mod c)*(b mod c)) mod c).

It may be noted that the terms $[x^{ki} \bmod g(x)]$ may be independent of payload M. On the other hand, the number of such terms may depend on the number of fragments that may be used for transmitting payload M. In some embodiments, for at least the purpose of reducing the amount of calculations in real-time or substantially in real-time, the terms $[x^{ki} \bmod g(x)]$ may be pre-calculated and stored in a memory (for example in the form of a look-up table) for any number of fragments, for example in accordance with a maximum size of a payload in a communication system and/or a maximum number of fragments that a transmitter may use in segmenting a payload. Thus, given a 0-initialized CRC code for each fragment $M_i$ of payload M (e.g. $CRC_0(M_i)$) and said pre-calculated values of the terms $[x^{ki} \bmod g(x)]$, calculation of a 0-initialized CRC code for payload M (e.g. $CRC_0(M)$) may comprise only low-complexity operations on arguments of r bits only, wherein the number of such operations may be in linear proportion to the number of fragments corresponding to payload M (e.g. for n fragments, n−1 multiplications, n−1 additions and one modular polynomial division). It may be noted that r may be a constant, independent of the number of bits in payload M, and in most cases significantly smaller than the length of payload M (e.g. r<<q) or of any of its fragments.

Considering the third step in Eq. 4, the following may be derived (Eq. 5):

$$CRC_0(M) = [M(x) * x^r] \bmod g(x) =$$
$$= \begin{Bmatrix} [[M_3(x)*x^r] \bmod g(x)] * [x^{k3} \bmod g(x)] + \\ [[M_2(x)*x^r] \bmod g(x)] * [x^{k2} \bmod g(x)] + \\ [[M_1(x)*x^r] \bmod g(x)] * [x^{k1} \bmod g(x)] + \\ [[M_0(x)*x^r] \bmod g(x)] \end{Bmatrix} \bmod g(x)$$
$$= \left[ \begin{Bmatrix} [[M_3(x)*x^r] \bmod g(x)] * [[x^{k3-2r}*x^r] \bmod g(x)] + \\ [[M_2(x)*x^r] \bmod g(x)] * [[x^{k2-2r}*x^r] \bmod g(x)] + \\ [[M_1(x)*x^r] \bmod g(x)] * [[x^{k1-2r}*x^r] \bmod g(x)] + \end{Bmatrix} * x^r \right]$$
$$\bmod g(x) + [[M_0(x)*x^r] \bmod g(x)]$$
$$= CRC_0 \begin{Bmatrix} CRC_0(M_3) * CRC_0(x^{k3-2r}) + \\ CRC_0(M_2) * CRC_0(x^{k2-2r}) + \\ CRC_0(M_1) * CRC_0(x^{k1-2r}) \end{Bmatrix} + CRC_0(M_0)$$

The second step of Eq. 5 may be the same as the third step of Eq. 4. The third step of Eq. 5 may be derived from the second step of Eq. 5 by excluding for the first three addition elements a common factor $x^r$ for all elements together and another $x^r$ factor for each $x^{ki}$ sub-element while compensating for these exclusions by reducing the degree of $x^{ki}$ by 2r (e.g. under the assumption that ki>2r, or in other words that the length of at least the first fragment ($M_0$) may be at least twice as long as the degree of the CRC polynomial g(x), as the above condition may have to be fulfilled for k1 as well, wherein k1 may be equal to the number of bits in fragment $M_0$). It may be noted that the third step of Eq. 5 may have structured the entire expression in a form, which may allow calculation of a 0-initialized CRC code for payload M (e.g. $CRC_0(M)$) using a pre-calculated 0-initialized CRC code for each of the fragments of payload M (e.g. $CRC_0(M_i)$) and using a pre-calculated 0-initialized CRC code for each of the polynomials $x^{ki-2r}$ (e.g. $CRC_0(x^{ki-2r})$, wherein each polynomial $x^{ki-2r}$ may represent a bit string of ki−2r+1 bits in which the most significant bit is set to 1 and all the other bits are set to 0), as shown in the fourth step of Eq. 5. The fourth step of Eq. 5 may show that both the pre-calculations (e.g. per fragment) and the final calculation (e.g. for payload M) may be performed as 0-initialized CRC calculations (e.g. $CRC_0$) or operations. The fourth step of Eq. 5 may further show that if the 0-initialized CRC code for each of the n fragments included in payload M (e.g. $CRC_0(M_i)$ for each i=0 . . . n−1) and the 0-initialized CRC codes for the n−1 polynomials $x^{ki-2r}$ (e.g. $CRC_0(x^{ki-2r})$ for each i=1 . . . n−1) are pre-calculated, the final calculation of the 0-initialized CRC code for the entire payload M (e.g. $CRC_0(M)$) may comprise only n−1 look-ups (e.g. for $CRC_0(x^{ki-2r})$), n−1 multiplications of low-degree polynomials (r bits each), 3 exclusive-or (XOR) operation (e.g. addition of 2r bit-long strings) and a single 0-initialized CRC calculation on a 2r bit-long string (e.g. which may be an operation performed using a constant amount of processing independent of the length of payload M). Thus the fourth step of Eq. 5 may be used in some embodiments for simplifying any of a hardware implementation or a software implementation, as a single circuit design (e.g. of one or more instances) or a single procedure for calculating a 0-initialized CRC code for a bit string may be utilized for performing nearly all the necessary calculations.

Having described methods for calculating a 0-initialized CRC code for a payload M using 0-initialized CRC codes that may be pre-calculated for each fragment included in the payload and for predefined bit strings, the following may describe a method for calculating a 1-initialized CRC code for a payload M in a similar manner.

Considering Eq. 2 and Eq. 1, the following may be derived (Eq. 6):

$$CRC_1(M) = \{[M(x) + F(x) * x^{(q-r)}] * x^r\} \bmod g(x)$$
$$= [M(x) * x^r] \bmod g(x) + [F(x) * x^{q-r} * x^r] \bmod g(x)$$
$$= CRC_0(M) + CRC_1(Z_q)$$

Wherein F(x) may be a polynomial representing r bits all set to 1, and $Z_q$ may be a bit string of length q (e.g. the same length of payload M) in which all bits may be set to 0. Since $Z_q$ may be a constant bit string for any given size of payload M (q), a 1-initialized CRC code for $Z_q$ (e.g. $CRC_1(Z_q)$) may be pre-calculated and stored in a memory for any applicable value of q.

By combining the last step of Eq. 5 (e.g. for calculating a 0-initialized CRC code for payload M) into Eq. 6, the following may be derived (Eq. 7):

$$CRC_1(M) = CRC_0(M) + CRC_1(Z_q)$$
$$= CRC_0 \begin{Bmatrix} CRC_0(M_3) * CRC_0(x^{k3-2r}) + \\ CRC_0(M_2) * CRC_0(x^{k2-2r}) + \\ CRC_0(M_1) * CRC_0(x^{k1-2r}) \end{Bmatrix} + CRC_0(M_0) +$$
$$CRC_1(Z_q)$$

Putting Eq. 7 in a more general form (Eq. 8):

$$CRC_1(M) = CRC_0 \begin{Bmatrix} CRC_0(M_{n-1}) * CRC_0(x^{kn-1-2r}) + \\ \ldots + \\ CRC_0(M_1) * CRC_0(x^{k1-2r}) \end{Bmatrix} +$$
$$CRC_0(M_0) + CRC_1(Z_q)$$

Wherein M may represent the entire payload, $M_0$ to $M_{n-1}$ may represent the n fragments of the payload, ki may represent the offset (e.g. in bits) of a fragment $M_i$ within the payload (i=1 ... n−1), r may represent the size of the CRC polynomial (e.g. r=32 for CRC-32), $Z_q$ may represent a bit string of the same length as the payload in which all bits are set to 0, $CRC_0$ may represent a 0-initialized CRC code, and $CRC_1$ may represent a 1-initialized CRC code.

Thus, re-assembler 132 may be configured to calculate a (1-initialized) CRC code for a payload M (e.g. $CRC_1(M)$), the payload M reassembled from n fragments (e.g. $M_0$ to $M_{n-1}$), using a method comprising:

a) Calculating or receiving a 0-initialized CRC code for each received fragment (e.g. $CRC_0(M_i)$, i=0 ... n−1).

b) Using pre-calculated 0-initialized CRC codes for the n−1 polynomials $x^{ki-2r}$ (e.g. $CRC_0(x^{ki-2r})$, i=1 ... n−1), wherein the polynomial $x^{ki-2r}$ may represent a bit string of ki−2r+1 bits in which the most significant bit is set to 1 and all the other (ki−2r) bits are set to 0.

c) Calculating n−1 multiplications, wherein each multiplication may be of two polynomials of length r (e.g. $S_i = CRC_0(M_i) * CRC_0(x^{ki-2r})$, i=1 ... n−1) and the multiplication may be of length 2r bits, wherein r may be the degree of the CRC polynomial.

For example, in embodiments where CRC-32 may be used, a multiplication of 64 bits may be calculated by 16 sub-multiplications of 8-bit polynomials (e.g. that may be calculated using a 256 by 256 table) followed by shifts and XOR operations on the sub-multiplications.

d) Performing (2r bits wide) XOR operation over all n−1 multiplications calculated in step c) (e.g. $S_{n-1} + ... + S_1$).

e) Calculating the 0-initialized CRC code for the result of the XOR operation of step d) (e.g. $CRC_0(S_{n-1} + ... + S_1)$).

As previously described, re-assembler 132 may be configured, upon receiving each additional fragment of the payload, to calculate a CRC code for a reassembly of all the fragments of the payload already received. It may be noted that if the result of the XOR operation of step d) is stored in memory (e.g. $S_j + ... + S_1$ for fragments $M_1$ to $M_j$), upon receiving a next fragment (e.g. $M_{j+i}$) the 0-initialized CRC calculation for a reassembly of all the fragments of the payload already received (e.g. including the next fragment $M_{j+i}$) may be performed by simply calculating the respective multiplication for the next fragment (e.g. $S_{j+i}$), performing a 2r bit-long XOR operation between the previously stored result and the calculated multiplication of the next segment (e.g. $S_{j+i} + (S_j + ... + S_1)$), recalculating the 0-initialized CRC code on the updated 2r bit-long XOR result (e.g. $CRC_0(S_{j+1} + ... + S_1)$) and performing the rest of the steps described herein. The above shortcut may be applicable if the received next fragment (e.g. $M_{j+1}$) does not precede any of the previously received fragments (e.g. if it is added at the end of a list of fragments (e.g. as shown in step 250 of FIG. 2)). In case the next fragment arrives out-of-order, all the multiplications may have to be recalculated, for example due to changes in the respective offsets of one or more of the previously received fragments.

f) Performing XOR operation on the result of step e) with the previously calculated or received 0-initialized CRC code for the first fragment (e.g. $CRC_0(S_{n-1} + ... + S_1) + CRC_0(M_0)$).

g) Performing a XOR operation on the result of step f) with a pre-calculated 1-initialized CRC code for a bit steam of the same length of payload M in which all bits may be set to 0 (e.g. $CRC_0(S_{n-1} + ... + S_1) + CRC_0(M_0) + CRC_1(Z_q)$).

In some embodiments, communication system 100 may be a satellite communication system comprising one or more terminals (e.g. transmitter(s) 120*a-n*) configured to transmit over a satellite (e.g. medium 110) towards a central hub (e.g. receiving station 130), wherein several terminals may simultaneously transmit towards the hub using a plurality of channels over the satellite.

At least one terminal of the one or more terminals may be configured to segment a payload to be transmitted towards the hub (e.g. an Internet Protocol (IP) packet or any other type of packet or a frame that may be transmitted from a terminal to the hub) to one or more fragments, and to transmit the one or more fragments towards the hub using one or more separate transmissions, for example burst transmissions over a Time Division Multiple Access (TDMA) or a Multi-Frequency Time Division Multiple Access (MF-TDMA) return channel. The at least one terminal may be further configured to compute a CRC code for the payload and to transmit the computed CRC code together with the first fragment of the payload, e.g. in the same transmission.

The hub may comprise a plurality of receivers (e.g. receivers 131*a-k*) configured to receive transmissions from the one or more terminals, said transmissions containing one or more fragments of one or more payloads, and at least one processing element (e.g. re-assembler 132) configured to re-assemble a payload from one or more received fragments of the payload and to validate the content of the payload. Said plurality of receivers may be configured to maintain a synchronized clock and to timestamp received fragments in accordance with said clock for at least the purpose of allowing the at least one processing element to order and/or reorder received fragments in accordance with their transmission time.

The at least one processing element may be further configured to calculate a CRC code for a payload using one or more CRC codes previously calculated for one or more fragments of the payload respectively, wherein the CRC codes for the one or more fragments may be either calculated by the processing element or received by the processing element with the fragments (e.g. the receivers may be configured to calculate a CRC code for each received fragment and to attach the calculated CRC code to the received fragment upon forwarding it to the processing element). The at least one processing element may be further configured upon receiving each fragment to perform said calculation on all the already received fragments and to use the calculated CRC code for at least the purpose of validating the payload (e.g. verifying that all the fragments of the payload were correctly received) with a minimum amount of computation, while perhaps introducing a minimum latency and without needing the fragments to be numbered.

In some embodiments, the at least one processing element may be configured to calculate a CRC code for a payload as a 1-initialized CRC code in accordance with the formula (Eq. 9):

$$CRC_1(M) = CRC_0 \left\{ \begin{array}{c} CRC_0(M_{n-1}) * CRC_0(x^{k_{n-1}-2r}) + \\ ... + \\ CRC_0(M_1) * CRC_0(x^{k_1-2r}) \end{array} \right\} +$$
$$CRC_0(M_0) + CRC_1(Z_q)$$

Wherein M may represent the entire payload, $M_0$ to $M_{n-1}$ may represent the n fragments of the payload, ki may represent the offset (e.g. in bits) of a fragment $M_i$ within the payload (i=1 . . . n−1), r may represent the size of the CRC polynomial (e.g. r=32 for CRC-32), Zq may represent a bit string of the same length as the payload in which all bits are set to 0, $CRC_0$ may represent a 0-initialized CRC code, and $CRC_1$ may represent a 1-initialized CRC code.

Various aspects of the disclosure may be embodied as one or more methods, systems, apparatuses (e.g., components of a satellite communication network), and/or computer program products. Accordingly, those aspects may take the form of an entirely hardware embodiment, an entirely software embodiment, an entirely firmware embodiment, or an embodiment combining firmware, software, and/or hardware aspects. Furthermore, such aspects may take the form of a computer program product stored by one or more computer-readable storage media having computer-readable program code, or instructions, embodied in or on the storage media. Any suitable computer readable storage media may be utilized, including hard disks, CD-ROMs, optical storage devices, magnetic storage devices, and/or any combination thereof. In some embodiments, one or more computer readable media storing instructions may be used. The instructions, when executed, may cause one or more apparatuses to perform one or more acts described herein. The one or more computer readable media may comprise transitory and/or non-transitory media. In addition, various signals representing data or events as described herein may be transferred between a source and a destination in the form of electromagnetic waves traveling through signal-conducting media such as metal wires, optical fibers, and/or wireless transmission media (e.g., air and/or space).

Modifications may be made to the various embodiments described herein by those skilled in the art. For example, each of the elements of the aforementioned embodiments may be utilized alone or in combination or sub-combination with elements of the other embodiments. It will also be appreciated and understood that modifications may be made without departing from the true spirit and scope of the present disclosure. The description is thus to be regarded as illustrative instead of restrictive on the present disclosure.

What is claimed is:

1. A method, comprising:
   receiving a fragment of a payload;
   identifying a list of fragments containing one or more other fragments of the payload;
   adding the fragment to the list of fragments in accordance with a timestamp associated with the fragment and in accordance with one or more timestamps associated with one or more other fragments included in the list of fragments, so that, after the fragment is added to the list of fragments, the list of fragments is ordered by reception time;
   determining whether the list of fragments includes a leading fragment of the payload; and
   responsive to determining that the list of fragments includes a leading fragment of the payload:
      calculating a Cyclic Redundancy Check (CRC) code for a reassembly comprising the fragment of the payload and the one or more other fragments of the payload, wherein said calculating uses one or more CRC codes previously calculated for the one or more other fragments of the payload;
      comparing the CRC code for the reassembly with a CRC code included in the leading fragment of the payload to determine if the CRC code for the reassembly and the CRC code included in the leading fragment of the payload are the same; and
      responsive to determining that the CRC code for the reassembly and the CRC code included in the leading fragment of the payload are the same, terminating a reassembly process associated with the payload.

2. The method of claim 1, wherein determining whether the list of fragments includes a leading fragment of the payload comprises:
   determining if a fragment in the list of fragments that was transmitted before each other fragment in the list of fragments includes a Cyclic Redundancy Check (CRC) code for the payload.

3. The method of claim 1, further comprising:
   responsive to determining that the list of fragments does not include a leading fragment of the payload:
      waiting a period of time for at least one additional fragment of the payload to be received;
      determining that the period of time has exceeded a preconfigured interval; and
      responsive to determining that the period of time has exceeded the preconfigured interval, discarding the fragment of the payload and the one or more other fragments of the payload.

4. The method of claim 1, further comprising:
   responsive to determining that the CRC code for the reassembly and the CRC code included in the leading fragment of the payload are not the same:
      waiting a period of time for at least one additional fragment of the payload to be received;
      determining that the period of time has exceeded a preconfigured interval; and
      responsive to determining that the period of time has exceeded the preconfigured interval, discarding the fragment of the payload and the one or more other fragments of the payload.

5. The method of claim 1, wherein terminating the reassembly process associated with the payload is not based on a numbering indicating a transmission order of fragments of the payload.

6. The method of claim 1, wherein a CRC code for the fragment is at least one of:
   received with the fragment;
   calculated upon receiving the fragment;
   calculated upon adding the fragment to the list of fragments; or
   calculated at a time prior to calculating the CRC code for the reassembly.

7. The method of claim 1, wherein calculating the CRC code for the reassembly comprises calculating a 1-initialized CRC code for the reassembly, and wherein the one or more CRC codes previously calculated for the one or more other fragments are 0-initialized CRC codes.

8. The method of claim 1, wherein calculating the CRC code for the reassembly comprises:
   calculating or receiving a 0-initialized CRC code for each fragment in the list of fragments, wherein the list of fragments includes n fragments;
   performing n−1 multiplications, wherein each of the n−1 multiplications is of a 0-initialized CRC code of a fragment i and a pre-calculated 0-initialized CRC code of a polynomial $x^{ki-2r}$, wherein said fragment i does not comprise least significant bits of the reassembly, the polynomial $x^{ki-2r}$ corresponds to an offset ki of said fragment i in the reassembly, and r corresponds to a size of a polynomial for the CRC code;

performing a first exclusive-or (XOR) operation, said first XOR operation being performed over one or more products of said n−1 multiplications;
calculating a 0-initialized CRC code for a result of the first XOR operation;
performing a second XOR operation, said second XOR operation being performed on the 0-initialized CRC code for the result of the first XOR operation and a 0-initialized CRC code for a fragment containing the least significant bits of the reassembly; and
performing a third XOR operation on the result of the second XOR operation and a pre-calculated 1-initialized CRC code for a bit stream having a length corresponding to a length of the reassembly, said bit stream comprising only bits set to 0.

9. The method of claim 8, comprising:
upon calculation of a CRC code for a first reassembly, storing the result of the first XOR operation;
upon calculation of a CRC code for a second reassembly comprising fragments of the first reassembly and an additional fragment, determining whether the additional fragment is ordered last in the list of fragments;
responsive to determining that the additional fragment is not ordered last in the list of fragments:
  performing n−1 multiplications for the second reassembly, wherein each of the n−1 multiplications for the second reassembly is of a 0-initialized CRC code of a fragment i and a pre-calculated 0-initialized CRC code of a polynomial $x^{ki-2r}$, wherein said fragment i does not comprise least significant bits of the second reassembly, the polynomial $x^{ki-2r}$ corresponds to an offset ki of said fragment i in the second reassembly, and r corresponds to a size of a polynomial for the CRC code;
  performing a fourth XOR operation, said fourth XOR operation being performed over one or more products of said n−1 multiplications for the second reassembly; and
  storing a result of the fourth XOR operation in memory; and
responsive to determining that the additional fragment is ordered last in the list of fragments:
  performing a multiplication for the additional fragment, wherein the multiplication for the additional fragment is of a 0-initialized CRC code of the additional fragment and a pre-calculated 0-initialized CRC code of a polynomial $x^{ki-2r}$, wherein the polynomial $x^{ki-2r}$ corresponds to an offset ki of the additional fragment in the second reassembly, and r corresponds to a size of a polynomial for the CRC code;
  performing a fifth XOR operation, said fifth XOR operation being performed on a result of the multiplication for the additional fragment and the result of the first XOR operation; and
  storing a result of the fifth XOR operation.

10. An apparatus, comprising:
at least one processor; and
a memory storing instructions that when executed by the at least one processor cause the apparatus to:
  receive a fragment of a payload;
  timestamp the fragment;
  identify a list of fragments containing one or more other fragments of the payload;
  add the fragment to the list of fragments in accordance with the timestamp and one or more other timestamps associated with the one or more other fragments, so that the list of fragments is ordered by reception time;
  determine whether the list of fragments includes a leading fragment of the payload; and
  responsive to determining that the list of fragments includes a leading fragment of the payload:
    utilize one or more Cyclic Redundancy Check (CRC) codes previously calculated for the one or more other fragments of the payload to calculate a CRC code for a reassembly comprising the fragment and the one or more other fragments of the payload;
    compare the CRC code for the reassembly with a CRC code included in the leading fragment of the payload to determine if the CRC code for the reassembly and the CRC code included in the leading fragment of the payload are the same; and
    responsive to determining that the CRC code for the reassembly and the CRC code included in the leading fragment of the payload are the same, terminate a reassembly process associated with the payload.

11. The apparatus of claim 10, wherein terminating the reassembly process associated with the payload is not based on a numbering indicating a transmission ordering of fragments of the payload.

12. The apparatus of claim 10, comprising a plurality of receivers and a re-assembler, wherein each receiver of said plurality of receivers is configured to:
  maintain a clock synchronized with one or more clocks of one or more other receivers of said plurality of receivers;
  receive one or more fragments of the payload;
  utilize said clock to timestamp the one or more fragments of the payload upon receipt; and
  forward the one or more fragments of the payload to the re-assembler.

13. The apparatus of claim 12, wherein at least one receiver of the plurality of receivers is configured to calculate a CRC code for at least one of the one or more fragments of the payload upon receipt, and forward said CRC code to the re-assembler with the at least one of the one or more fragments of the payload.

14. The apparatus of claim 12, wherein the re-assembler is configured to calculate a CRC code for at least one of the one or more fragments of the payload prior to the CRC code for the reassembly being calculated.

15. The apparatus of claim 10, wherein the CRC code for the reassembly is a 1-initialized CRC code, and wherein the one or more CRC codes previously calculated for the one or more other fragments of the payload are 0-initialized CRC codes.

* * * * *